(12) United States Patent
Zhu et al.

(10) Patent No.: US 8,598,662 B2
(45) Date of Patent: Dec. 3, 2013

(54) SEMICONDUCTOR DEVICE AND METHOD FOR FORMING THE SAME

(75) Inventors: Huilong Zhu, Poughkeepsie, NY (US); Qingqing Liang, Beijing (CN); Zhijiong Luo, Poughkeepsie, NY (US); Haizhou Yin, Poughkeepsie, NY (US)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 103 days.

(21) Appl. No.: 13/063,745

(22) PCT Filed: Mar. 2, 2011

(86) PCT No.: PCT/CN2011/000338
§ 371 (c)(1),
(2), (4) Date: Mar. 11, 2011

(87) PCT Pub. No.: WO2012/000302
PCT Pub. Date: Jan. 5, 2012

(65) Prior Publication Data
US 2012/0223331 A1    Sep. 6, 2012

(51) Int. Cl.
*H01L 27/12* (2006.01)
*H01L 21/84* (2006.01)
*H01L 21/336* (2006.01)

(52) U.S. Cl.
USPC ............. 257/347; 257/E27.112; 438/157; 438/151; 438/283; 438/300

(58) Field of Classification Search
USPC ............ 257/77, 329, 369, 183, E29.068, 257/E21.409, E21.632, E27.062, E29.262, 257/E21.41, E27.112, 347; 438/143, 157, 438/302, 303, 305, 306, 369, 370, 372, 505, 438/506, 519, 300
See application file for complete search history.

(56) References Cited

U.S. PATENT DOCUMENTS 5,739,057 A * 4/1998 Tiwari et al. .................. 438/172
6,396,108 B1 * 5/2002 Krivokapic et al. .......... 257/365
(Continued)

FOREIGN PATENT DOCUMENTS

CN    1638067    7/2005
CN    1695227    11/2005
(Continued)

OTHER PUBLICATIONS

Chu, et al., "Effect of thermal oxidation on residual stress distribution through the thickness of p+ silicon films," Solid-State Sensor and Actuator Workshop, 1992. 5th Technical Digest., IEEE, Jun. 22, 1992, pp. 90-93.*

(Continued)

*Primary Examiner* — Mary Wilczewski
*Assistant Examiner* — Erik T Peterson
(74) *Attorney, Agent, or Firm* — Troutman Sanders LLP

(57) ABSTRACT

A semiconductor device comprises: a semiconductor substrate located on an insulating layer; and an insulator located on the insulating layer and embedded in the semiconductor substrate, wherein the insulator applies stress therein to the semiconductor substrate. A method for forming a semiconductor device comprises: forming a semiconductor substrate on an insulating layer; forming a cavity within the semiconductor substrate so as to expose the insulating layer; forming an insulator in the cavity, wherein the insulator applies stress therein to the semiconductor substrate. It facilitates the reduction of the short channel effect, the resistance of source/drain regions and parasitic capacitance.

24 Claims, 9 Drawing Sheets

(56) References Cited

U.S. PATENT DOCUMENTS

| | | | |
|---|---|---|---|
| 6,413,802 B1* | 7/2002 | Hu et al. | 438/151 |
| 6,610,576 B2* | 8/2003 | Nowak | 438/301 |
| 6,727,546 B2* | 4/2004 | Krivokapic et al. | 257/331 |
| 6,800,885 B1* | 10/2004 | An et al. | 257/275 |
| 6,921,963 B2* | 7/2005 | Krivokapic et al. | 257/618 |
| 6,939,751 B2* | 9/2005 | Zhu et al. | 438/151 |
| 7,074,656 B2* | 7/2006 | Yeo et al. | 438/157 |
| 7,105,390 B2* | 9/2006 | Brask et al. | 438/149 |
| 7,449,373 B2* | 11/2008 | Doyle et al. | 438/149 |
| 7,456,068 B2* | 11/2008 | Kavalieros et al. | 438/301 |
| 7,601,574 B2* | 10/2009 | Pan | 438/183 |
| 2002/0033511 A1* | 3/2002 | Babcock et al. | 257/408 |
| 2003/0178677 A1* | 9/2003 | Clark et al. | 257/347 |
| 2004/0195627 A1* | 10/2004 | Dakshina-Murthy et al. | 257/347 |
| 2004/0256647 A1* | 12/2004 | Lee et al. | 257/289 |
| 2005/0112817 A1* | 5/2005 | Cheng et al. | 438/219 |
| 2005/0145941 A1* | 7/2005 | Bedell et al. | 257/348 |
| 2005/0145954 A1 | 7/2005 | Zhu | |
| 2005/0156202 A1* | 7/2005 | Rhee et al. | 257/213 |
| 2006/0063332 A1* | 3/2006 | Doyle et al. | 438/267 |
| 2007/0190708 A1 | 8/2007 | Kaneko | |
| 2008/0001227 A1* | 1/2008 | Zhu et al. | 257/353 |
| 2008/0296632 A1 | 12/2008 | Moroz | |
| 2009/0026530 A1* | 1/2009 | Wilson et al. | 257/328 |
| 2009/0072316 A1 | 3/2009 | Topaloglu | |
| 2009/0152623 A1 | 6/2009 | Goto | |
| 2010/0038679 A1 | 2/2010 | Chan | |

FOREIGN PATENT DOCUMENTS

| | | |
|---|---|---|
| CN | 1848454 | 10/2006 |
| CN | 101677085 | 3/2010 |

OTHER PUBLICATIONS

International Search Report for PCT/CN2011/000338.

* cited by examiner

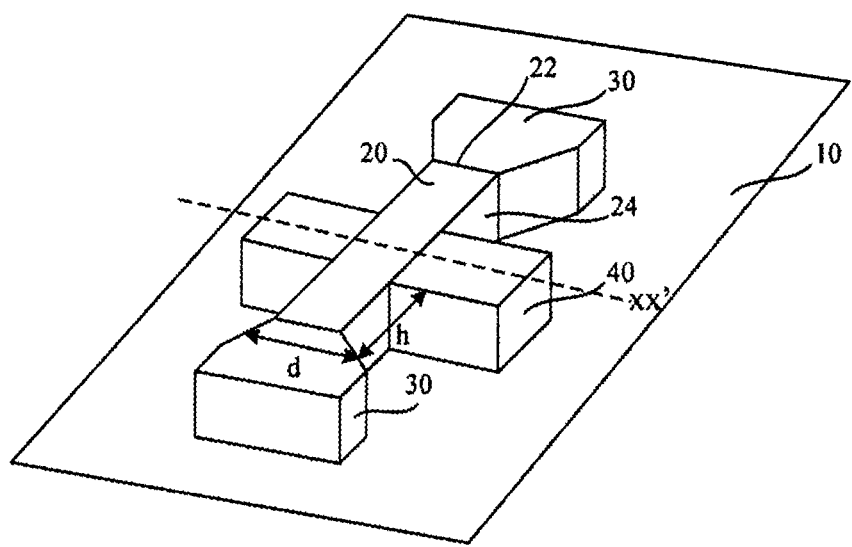
Fig. 1 --PRIOR ART--
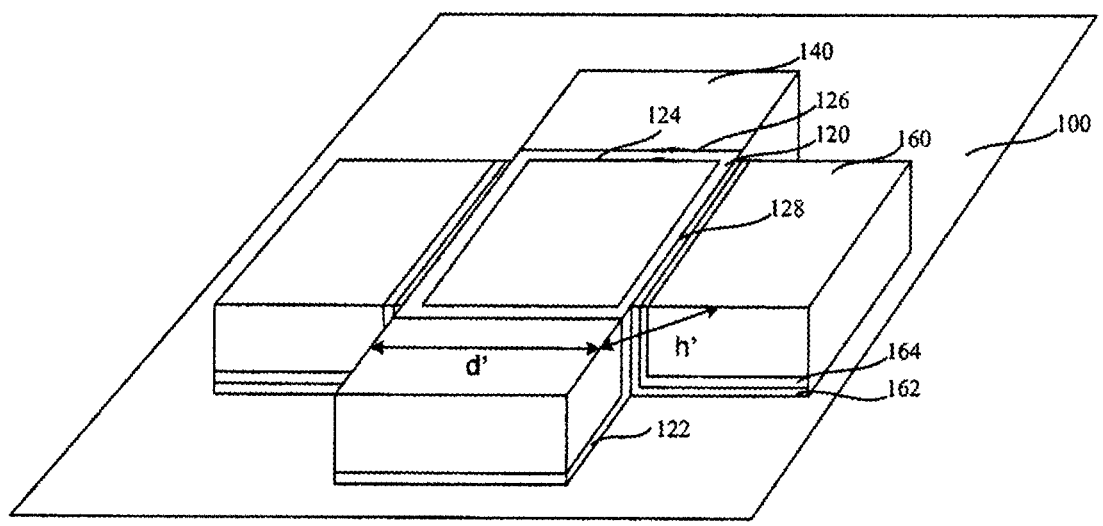
Fig. 2

SEMICONDUCTOR DEVICE AND METHOD FOR FORMING THE SAME

BENEFIT CLAIMS

This application is a US National Stage of International Application No. PCT/CN2011/000338, filed Mar. 2, 2011, which claims the benefit of CN 201010223870.7, filed Jul. 1, 2010.

TECHNICAL FIELD

The present invention relates to the field of semiconductor technology, and particularly, to a semiconductor device and a method for forming the same.

BACKGROUND

As the channel length of MOSFETs (Metal Oxide Field-effect Transistors) has been scaled increasingly, a series of effects, which are ignorable in an MOSFET long-channel model, are becoming more and more significant and are even becoming a dominant factor in affecting performance, and are collectively referred to as the short-channel effects. The short-channel effects tend to deteriorate the electrical performance of a device, for example causing the problems of reducing the threshold voltage of a gate, increasing the power consumption, and reducing the signal to noise ratio, etc.

In order to control the short-channel effects, more dopant elements (such as phosphorus, boron, etc.) have to be doped into the channel. However, this tends to lead to reduced carrier mobility in the channel of a device. There also exists problems to control the steepness of the profile for the dopants to be doped into the channel, which tends to cause severe short-channel effects. Secondly, the traditional SiGe PMOS strained silicon technology also encounters a bottleneck, making it difficult to provide stronger strain for the channel. Furthermore, there is also a bottleneck for the thickness of a gate oxide dielectric, and it is difficult for the speed in reducing the thickness of the gate oxide to keep pace with that in reducing the gate width, resulting in a larger leaking current of the gate dielectric. The critical dimensions are reduced continuously, possibly causing continued increase of the resistance for the source/drain regions and higher power consumption of the device.

Currently, the dominant thinking in the industry is to improve the traditional planar device technology, reduce the thickness of the channel region, and eliminate the intermediate layer on the bottom of a depletion layer in the channel, so that the depletion layer in the channel may fill up the whole channel region, which is the so-called fully depleted (FD) device, while the traditional planar devices belong to the partially depleted (PD) devices.

However, in order to fabricate a fully depleted device, it requires extremely thin thickness of silicon layer at the channel. The traditional manufacturing process, particularly the traditional bulk silicon-based manufacturing process, has difficulties in producing a structure meeting such requirements or has high costs. Even in terms of the emerging SOI (Silicon-On-Insulator) process, the thickness of the channel silicon layer is still difficult to be controlled at a relatively thin level. Regarding the complete concept of the realization for a fully depleted device, the focus of R&D efforts is turning to the stereoscopic device structure, i.e., to the fully depleted dual-gate or tri-gate technology.

The stereoscopic device structure (also referred to as a vertical device in some documents) refers to the technology in which the cross sections of the source/drain regions and of the gates of a device are not located within the same plane, and it belongs to a FinFet (Fin Field-effect Transistor) structure.

After turning to the stereoscopic device structure, the channel region is no longer compriseed in the bulk silicon or SOI, and becomes independent from these structures. Therefore, the fully depleted channel with extremely thin thickness may be fabricated by means of etching, etc.

FIG. 1 shows a currently proposed stereoscopic semiconductor device, the semiconductor device comprising: a semiconductor substrate 20, the semiconductor substrate 20 is located on an insulating layer 10; source/drain regions 30, the source/drain regions 30 abut a first set of opposite side surfaces 22 of the semiconductor substrate 20; gates 40 located on second side surfaces 24 of the semiconductor substrate 20 abutting the first side surfaces 22 (a gate dielectric layer and a work function metal layer sandwiched between the gates 40 and the semiconductor substrate 20 are not shown in the figure). In this case, in order to reduce the resistance of the source/drain regions, the edge of the source/drain regions 30 may be extended, i.e., the width of the source/drain regions 30 (in the xx' direction) is larger than the thickness of the semiconductor substrate 20. Therefore, with the increase of the width (d) of the source/drain regions 30, the parasitic capacitances between the source/drain regions 30, the gates 40 and the semiconductor substrate 20 increase, thus increasing the delay by the resistance and the capacitance or decreasing the alternative current performance of the device.

SUMMARY OF THE INVENTION

In order to solve the above mentioned problems, the present invention provides a semiconductor device and a method for forming the same, which facilitate the reduction of the short-channel effect, the resistance of source/drain regions and the parasitic capacitance.

A semiconductor device provided by the present invention comprises:

a semiconductor substrate located on an insulating layer;

source/drain regions abutting a first set of opposite side surfaces in the semiconductor substrate;

gates located on a second set of opposite side surfaces in the semiconductor substrate;

and further comprises an insulator located on the insulating layer and embedded in the semiconductor substrate, wherein the insulator applies stress therein to the semiconductor substrate.

Optionally, channel layers and mask layers are sandwiched between the second side surfaces and the insulator, and the channel layers are sandwiched between the insulating layer and the mask layers.

Optionally, the channel layer has a thickness of 5 nm to 40 nm in a direction perpendicular to the second side surfaces.

Optionally, for an NMOS device, the channel layer comprises a P-type super-steep retrograde well; or for a PMOS device, the channel layer comprises an N-type super-steep retrograde well.

Optionally, in a direction perpendicular to the insulating layer, the gates or the insulator covers at least the channel layers.

Optionally, the insulator has a tensile stress for a PMOS device, or a compression stress for an NMOS device.

Optionally, the material of the insulator is one of silicon nitride and silicon oxide, or a combination thereof.

Optionally, the first side surfaces are perpendicular to the second side surfaces.

Optionally, the semiconductor device further comprises a semiconductor assisting substrate, the upper surface of the semiconductor assisting substrate is lower than the upper surface of the semiconductor substrate, the semiconductor assisting substrate abuts the first side surfaces, and the source/drain regions are formed on the semiconductor assisting substrate.

Optionally, the semiconductor assisting substrate comprises Si. For a PMOS device, the source/drain regions are $Si_{1-x}Ge_x$; or for an NMOS device, the source/drain regions are Si:C.

Optionally, in the $Si_{1-x}Ge_x$, X has a value ranging from 0.1 to 0.7.

Optionally, in the Si:C, the value of the atomic number percentage of C is in the range of 0.2% to 2%.

A method for forming a semiconductor device provided by the present invention comprises:

forming a semiconductor substrate on an insulating layer;

forming source/drain regions abutting a first set of opposite side surfaces in the semiconductor substrate;

forming gates located on an second set of opposite side surfaces in the semiconductor substrate;

removing a part of materials within the semiconductor substrate to form a cavity in the semiconductor substrate, so as to expose the insulating layer; and forming an insulator in the cavity, wherein the insulator applies stress therein to the semiconductor substrate.

Optionally, the step of forming the semiconductor substrate comprises:

Forming, on the insulating layer, a first semiconductor layer, a stop layer, a patterned sacrificial layer and a patterned protective layer, and a first spacer surrounding the patterned sacrificial layer and protective layer;

forming the stop layer and the first semiconductor layer which are patterned with the first spacer as a mask;

determining the source/drain regions and removing the first spacer, the protective layer and the sacrificial layer which cover the source/drain regions, so as to expose the stop layer;

forming a second spacer surrounding the protective layer and the sacrificial layer;

and the step of forming the cavity within the semiconductor substrate comprises:

removing the protective layer, the sacrificial layer and the first semiconductor layer using the first spacer and the second spacer as masks, wherein the material of the stop layer is different from the materials of the protective layer, the sacrificial layer, the first semiconductor layer, the first spacer and the second spacer.

Optionally, the first side surfaces are perpendicular to the second side surfaces.

Optionally, the first spacer has a thickness of 5 nm to 40 nm in a direction perpendicular to the second side surfaces.

Optionally, the step of forming the source/drain regions comprises: after having formed the semiconductor substrate, removing the stop layer located in the source/drain regions and a part of the first semiconductor layer in its thickness, so as to form a source/drain base layer; and forming a second semiconductor layer on the source/drain base layer.

Optionally, the first semiconductor layer comprises Si, and the second semiconductor layer is $Si_{1-x}Ge_x$ for a PMOS device, or Si:C for an NMOS device.

Optionally, in the $Si_{1-x}Ge_x$, X has a value ranging from 0.1 to 0.7.

Optionally, in the Si:C, the value of the atomic number percentage of C is in the range of 0.2% to 2%.

Optionally, before forming the second semiconductor layer on the source/drain base layer, it further comprises performing a first ion implantation operation along a direction facing the first side surfaces, so as to form a diffusion region and a halo.

Optionally, the step of forming the gates comprises:

forming a gate stack layer before determining the source/drain regions, so that the gate stack layer covers at least the patterned first semiconductor layer in the direction perpendicular to the insulating layer.

Optionally, it further comprises: performing a second ion implantation operation to the cavity after having formed the cavity, so as to form a P-type super-steep retrograde well for an NMOS device, or a N-type super-steep retrograde well for a PMOS device.

Optionally, the insulator covers at least the patterned first semiconductor layer.

Optionally, the insulator has tensile stress for a PMOS device, or compression stress for an NMOS device.

Optionally, the material of the insulator is one of silicon nitride and silicon oxide, or a combination thereof.

Compared with the prior art, by employing the technical solution provided by the present invention, it has the following advantages.

By forming an insulator in the semiconductor device, in a semiconductor substrate which provides the same thickness of the channel region as compared with that in the prior art, it is possible for the distance between each gate formed on the second side surfaces of the semiconductor substrate to be increased, which may in turn increase the distance between the gates and the source/drain regions, and may facilitate the reduction of the parasitic capacitance. Furthermore, due to the introduction of the insulator, in a case that the height of the semiconductor substrate keeps constant, the peripheral area of the semiconductor substrate which has the same thickness of the channel region as compared with that in the prior art is increased, and the cross section area of the source/drain regions contacting with the semiconductor substrate is also increased accordingly (because of the increase of the width of the source/drain regions), which facilitates further reduction of the resistance of the source/drain regions. Moreover, by introducing the insulator, it forms a isolation region between the source/drain regions, which facilitates the reduction of the short-channel effect. Furthermore, by regulating the stress of the insulator so that, for example, the insulator has a tensile stress for a PMOS device, or a compression stress for an NMOS device, the insulator applies stress therein to the semiconductor substrate, which may generate opposite stress in the semiconductor substrate, i.e., a compression stress in the semiconductor substrate for a PMOS device, or a tensile stress in the semiconductor substrate for an NMOS device, and may facilitate further regulating of the stress in the channel region of the device, so as to further increase the carrier mobility in the channel region;

By forming, on a semiconductor layer located on the insulating layer, a sacrificial layer and first and second spacers surrounding the sacrificial layer, and then using the first and second spacer as hard masks, the semiconductor substrate is formed by self-alignment technology, which facilitates both the reduction of the number of masks and the refinement of the process. The effective area of the channel region may be increased by the gates covering at least the channel layers in a direction perpendicular to the insulating layer, and the carrier mobility in the channel region may be further increased. The stress may be applied uniformly to the channel region by the insulator covering at least the channel layers in a direction perpendicular to the insulating layer.

By forming the semiconductor assisting substrate and then forming the source/drain regions on the semiconductor assisting substrate, the source/drain regions may be formed by an epitaxial method. In a case that the semiconductor assisting substrate comprises Si, the material of the source/drain regions may be $Si_{1-X}Ge_X$ for a PMOS device, or Si:C for an NMOS device, which may facilitate regulating the stress in the channel region by the source/drain regions, so as to increase the carrier mobility in the channel region;

By forming the source/drain regions using an epitaxial method, it is necessary to form a source/drain base layer (a crystal seed layer, which may be a residual first semiconductor layer with certain thickness) before formation of the source/drain regions. The first semiconductor layer of the first side surfaces of the semiconductor substrate is partially exposed after formation of the source/drain base layer. Thus, a first ion implantation operation may be performed along a direction facing the first side surfaces, so as to form a doped region (such as a diffusion region and a halo) in the channel region of the device, and it is convenient for practical operation and beneficial for reduction of the distance between the adjacent semiconductor substrates, decrease of the area occupied by the device, and further reduction of the manufacturing costs.

A second ion implantation operation is performed to the cavity after formation of the cavity, so as to form a super-steep retrograded well (SSRW) in the semiconductor substrate, which facilitates the thinning of the depletion layer, thereby further reduction of the short-channel effect.

DESCRIPTION OF THE ACCOMPANYING DRAWINGS

Each of the following sectional views is obtained from cutting the formed structure along the line AA' given in the respective top view.

FIG. 1 is a schematic diagram of the structure of a semiconductor device in the prior art;

FIG. 2 is a schematic diagram of the structure of a semiconductor device provided by the present invention;

Figure 30:
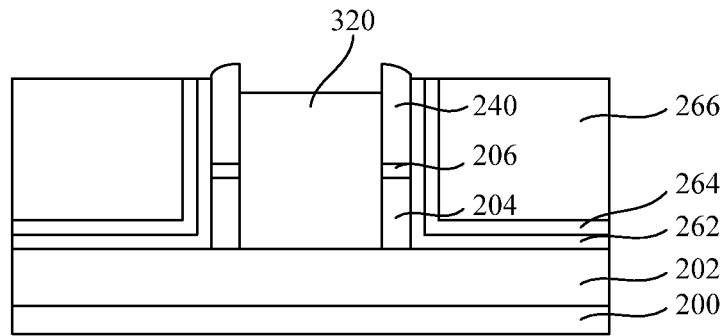
Figure 31:
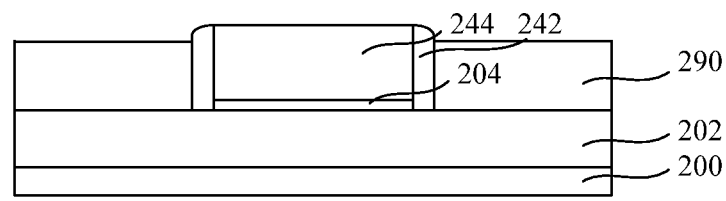
Figure 32:
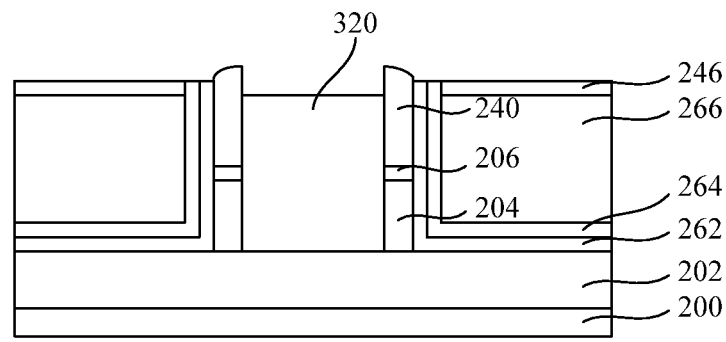
Figure 33:
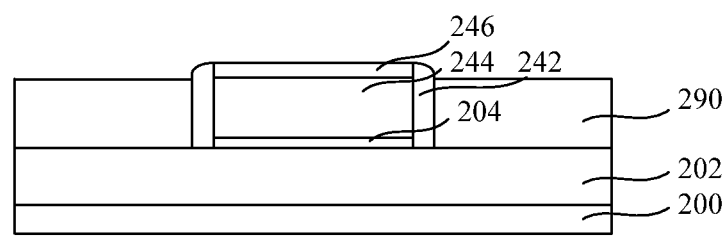

FIGS. 30 and 31 are sectional views after having removed the second dielectric layer to expose the gates and the source/drain regions, in an embodiment of the method for forming a semiconductor device according to the present invention; and FIGS. 32 and 33 are sectional views after having formed a contact region on the gates and the source/drain regions, in an embodiment of the method for forming a semiconductor device according to the present invention.

EMBODIMENTS

The following disclosure provides various embodiments or examples for realizing the technical solutions provided by the present invention. Although parts and arrangements in the particular examples will be described hereinafter, they are merely taken as examples and not intended to limit the present invention.

In addition, reference numbers and/or letters may be repeated in different embodiments of the present invention. Such repetitions are for the purpose of simplicity and clarity, and they do not indicate the relationships between various embodiments and/or arrangements discussed.

The present invention provides various examples of particular processes and/or materials. However, the alternative applications of other processes and/or other material, which would be appreciated by those skilled in the art, obviously do not depart from the protective scope claimed for the present invention. It needs to be emphasized that the mutual relationships between various structures described in this specification include necessary extensions made due to the needs of these processes or manufacturing procedures. For example, the term "perpendicular" means that the difference between the angle between two planes and 90° is within the scope allowed by the processes or manufacturing procedures.

As shown in FIG. 2, the semiconductor device provided by the present invention comprises: a semiconductor substrate 120 located on an insulating layer 100; source/drain regions 140 abutting a first set of opposite side surfaces 126 in the semiconductor substrate 120; gates 160 located on a second set of opposite side surfaces 128 in the semiconductor substrate 120; and an insulator 124 located on the insulating layer 100, embedded in the semiconductor substrate 120, and applying its stress on the semiconductor substrate 120.

When providing the semiconductor substrate 120 having the same thickness of the channel region as that in the prior art, the formation of the insulator 124 in the semiconductor substrate 120 may increase the distance between the gates 160 formed on the second side surfaces 128 of the semiconductor substrate 120, which in turn increases the distance h' between the gates 160 and the source/drain regions 140 and facilitates the reduction of the parasitic capacitance. Furthermore, due to the introduction of the insulator 124, provided that the height of the semiconductor substrate 120 keeps constant, the peripheral area of the semiconductor substrate 120 with the same thickness of the channel region as that in the prior art is increased, and the cross-section area of the source/drain regions 140 abutting the semiconductor substrate 120 is increased (because of the increase of the width d' of the source/drain regions 140), which facilitates the further reduction the resistance of the source/drain regions 140. Moreover, by introducing the insulator 124, a isolation region is formed between the source/drain regions 140, which facilitates the reduction of the short-channel effect. Furthermore, by regulating the stress of the insulator 124 (for example, it has a tensile stress in a PMOS device, or a compression stress in an NMOS device), the application of the stress in the insulator 124 to the semiconductor substrate 120 may generate an opposite stress in the semiconductor substrate 120 (i.e., a compression stress in the semiconductor substrate 120 for the PMOS device, or a tensile stress in the semiconductor substrate 120 for the NMOS device), which facilitates further regulating of the stress in the channel region of the device, so as to further increase the carrier mobility in the channel region.

In this case, the semiconductor substrate 120 may be silicon formed on the insulating layer 100. A doped region (such as a diffusion region and a halo) has been formed in the semiconductor substrate 120 to provide a channel region for the device. In one embodiment of the semiconductor device, channel layers and mask layers are sandwiched between the second side surfaces 128 and the insulator 124, and the channel layers are sandwiched between the insulating layer 100 and the mask layers. In this case, the material of the channel layer may comprise silicon (in which case the doped region has been formed). In a direction perpendicular to the second side surfaces, the channel layer has a thickness of 5 nm to 40 nm. The material of the mask layer may comprise silicon nitride, or laminated silicon oxide and silicon nitride. For an NMOS device, the channel layer may comprise a P-type super-steep retrograde well; and for a PMOS device, the channel layer may comprise an N-type super-steep retrograde well. In this case, the first side surfaces are perpendicular to the second side surfaces.

In the direction perpendicular to the insulating layer 100, the insulator 124 covers at least the channel layers, which facilitates uniformly applying the stress to the channel region.

The material of the insulator 124 is one of silicon nitride and silicon oxide, or a combination thereof.

The semiconductor device may further comprise a semiconductor assisting substrate 122. The semiconductor assisting substrate 122 abuts the first side surfaces 126, and the source/drain regions 140 may be formed on the semiconductor assisting substrate 122. As an example, the material of the semiconductor assisting substrate 122 may also comprise silicon. In this case, the source/drain regions 140 may be formed on the semiconductor assisting substrate 122 using an ion implantation process. In addition, the upper surface of the semiconductor assisting substrate 122 may be lower than the upper surface of the semiconductor substrate 120. In this specification, the upper surface refers to the side surface parallel to the insulating layer 100 in the semiconductor assisting substrate 122 or the semiconductor substrate 120. In this case, the source/drain regions 140 may be epitaxially formed on the semiconductor assisting substrate 122. When the material for the semiconductor assisting substrate 122 comprises Si, for the PMOS device, the material of the source/drain regions 140 may comprise $Si_{1-X}Ge_X$ (X has a value ranging from 0.1 to 0.7 and may be regulated flexibly depending on the need of the process, such as 0.2, 0.3, 0.4, 0.5 or 0.6. Unless specified otherwise in this specification, X has a value as described above and is omitted hereafter); or for an NMOS device, the material of the source/drain regions 140 may comprise Si:C (the value of the atomic number percentage of C may be in a range of 0.2% to 2%, such as 0.5%, 1% or 1.5%, and the content of C may be regulated flexibly depending on the need of the process. Unless specified otherwise in this specification, the atomic number percentage of C has the same value as described above and is omitted hereafter). It facilitates the further regulation of the stress in the channel region by using the source/drain regions 140, so as to increase the carrier mobility in the channel region.

The gates 160 may be formed on the second side surfaces 128 by laminated gate dielectric layers 162 and work function metal layers. The gate dielectric layer 162 may be formed of a hafnium-based material, such as one of $HfO_2$, HfSiO, HfSiON, HfTaO, HfTiO and HfZrO, or any combination thereof. And the work function metal layer 164 may comprise one of TiN, TiAlN, TaN and TaAlN, or any combination thereof. The gates 160 may be metal gates, preferably polycrystalline silicon gates, for facilitation of the process control. In a direction perpendicular to the insulating layer 100, the gates 160 cover at least the channel layers.

The present invention further provides a method for forming a semiconductor device.

Figure 3:
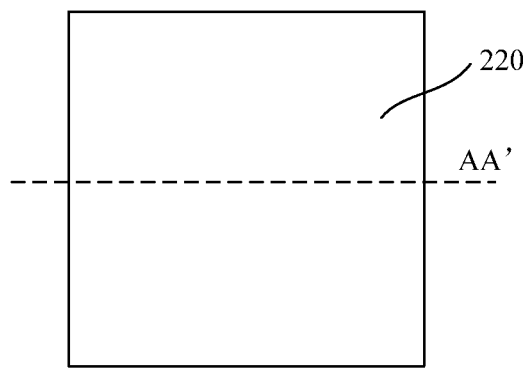
FIGS. 3 and 4 are a top view and a sectional view after having formed, on the substrate, each material layer needed to form a semiconductor device, in an embodiment of the method for forming a semiconductor device according to the present invention.
Figure 4:
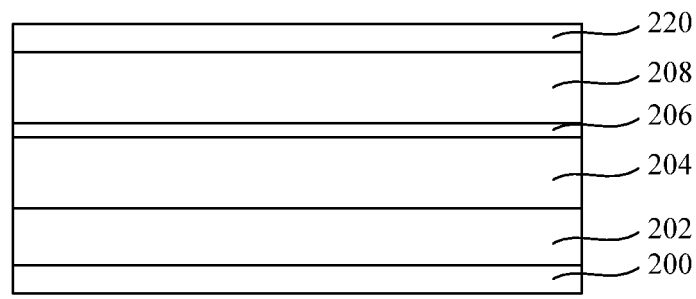
Figure 5:
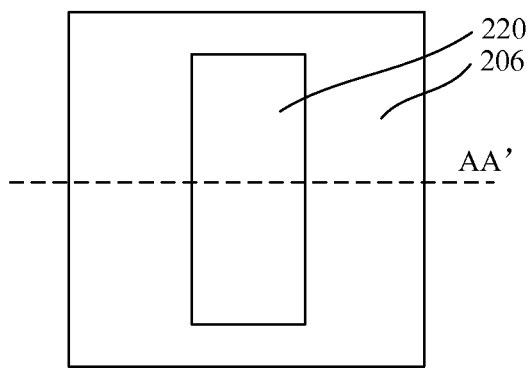
FIGS. 5 and 6 are a top view and a sectional view after having patterned a protective layer and a sacrificial layer, in an embodiment of the method for forming a semiconductor device according to the present invention.
Figure 6:
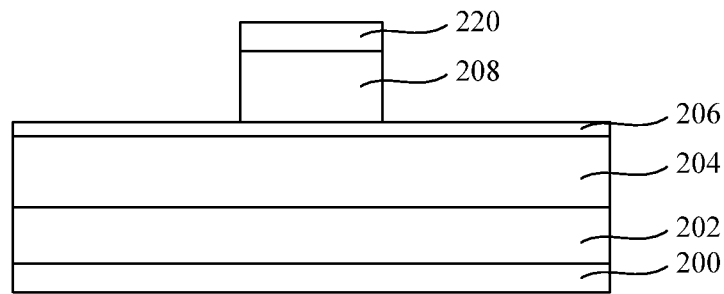
Figure 7:
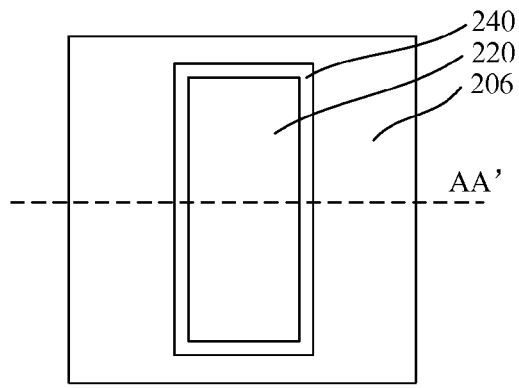
FIGS. 7 and 8 are a top view and a sectional view after having formed a first spacer, in an embodiment of the method for forming a semiconductor device according to the present invention.
Figure 8:
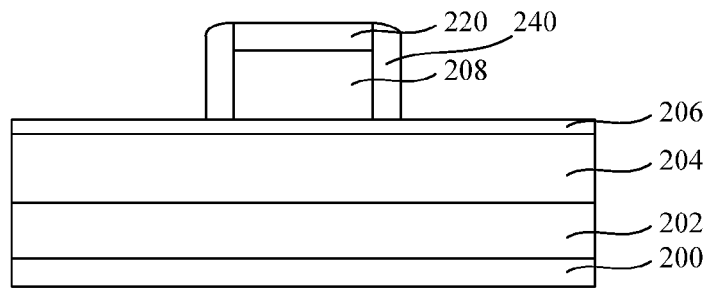

First, as shown in FIGS. 3 and 4, on an silicon-on-insulator (The silicon layer is a first semiconductor layer, and the first semiconductor layer may also be other semiconductor materials. The silicon-on-insulator is a structure of an insulating layer 202 and a silicon layer 204 formed on a substrate 200 in succession, and the substrate 200 is preferably a silicon substrate), a stop layer 206 (it may be silicon oxide), a sacrificial layer 208 (it may be amorphous silicon) and a protective layer 220 (it may be silicon carbide) are formed in succession. As shown in FIGS. 5 and 6, the protective layer 220 and the sacrificial layer 208 are patterned. The patterning operation may be performed using an etching process, and the etching operation ends up with the stop layer 206. Next, as shown in FIGS. 7 and 8, a first spacer 240 is formed which surrounds the patterned protective layer 220 and the patterned sacrificial layer 208. The material of the first spacer 240 may comprise silicon nitride, and the first spacer 240 may be formed using an etching back process. In this case, the first side surfaces may be perpendicular to the second side surfaces.

Figure 9:
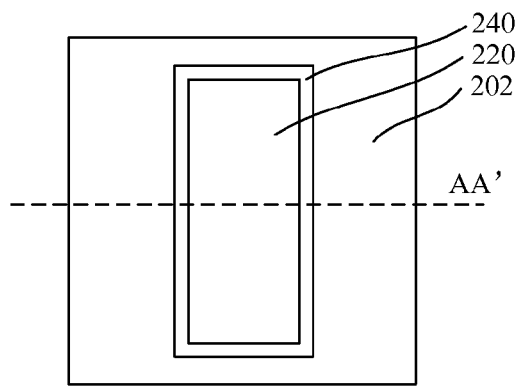
FIGS. 9 and 10 are a top view and a sectional view after having patterned a stop layer and a silicon layer, in an embodiment of the method for forming a semiconductor device according to the present invention.
Figure 10:
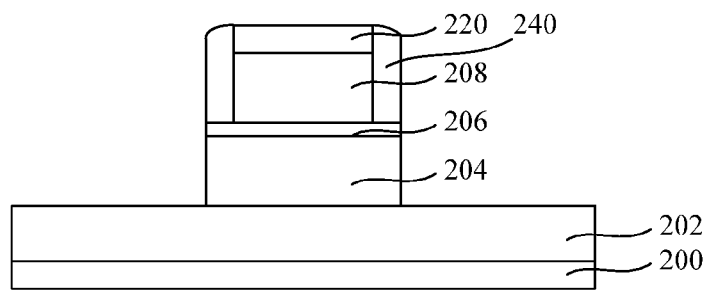
Figure 11:
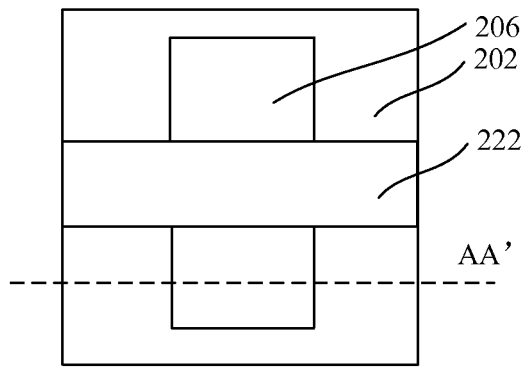
FIGS. 11 and 12 are a top view and a sectional view after exposing a stop layer in an area of source/drain regions, in an embodiment of the method for forming a semiconductor device according to the present invention.
Figure 12:
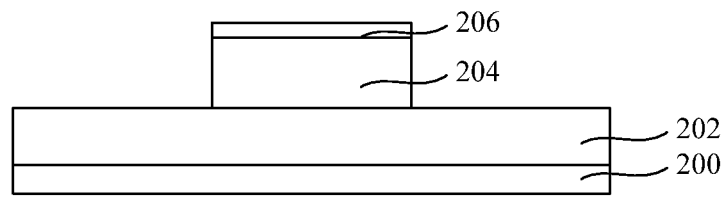
Figure 13:
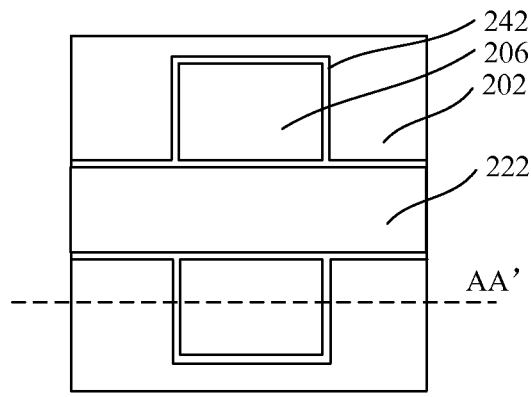
FIGS. 13 and 14 are a top view and a sectional view after having formed a second spacer, in an embodiment of the method for forming a semiconductor device according to the present invention.
Figure 14:
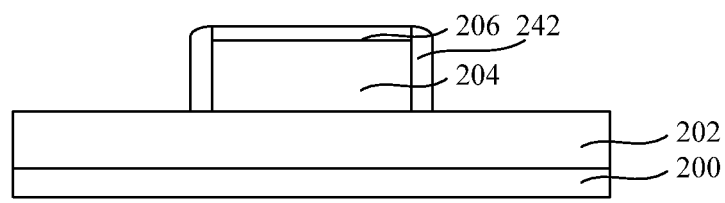

In this case, the thickness of the silicon layer 204 may be 50 nm to 100 nm, such as 60 nm, 70 nm, 80 nm or 90 nm. The thickness of the stop layer 206 may be 5 nm to 20 nm, such as 8 nm, 10 nm, 15 nm or 18 nm. The thickness of the sacrificial layer 208 may be 30 nm to 80 nm, such as 40 nm, 50 nm, 60 nm or 70 nm. The thickness of the protective layer 220 may be 20 nm to 50 nm, such as 25 nm, 30 nm, 35 nm or 40 nm. In a direction perpendicular to the second side surfaces, the thickness of the first spacer 240 may be 5 nm to 40 nm, such as 10 nm, 20 nm, 25 nm or 30 nm;

Then, as shown in FIGS. 9 and 10, the stop layer 206 and the silicon layer 204 are patterned with the first spacer 240 as a mask. The patterning operation may be performed using an etching process, and the etching operation ends up with the insulating layer 202. Next, as shown in FIGS. 11 and 12, an area of the source/drain regions are determined, and the first spacer 240, the protective layer 220 and the sacrificial layer 208 which cover the area are removed, so as to expose the stop layer 206 (a hard mask 222 may be formed on the area of the non-source/drain regions, the hard mask 222 may be located on the protective layer 220 in the above mentioned step, and the hard mask 222 may be removed in an appropriate step, for example, after exposing the stop layer 220 located in the source/drain regions). At the same time, the side surfaces abutting the source/drain regions in the protective layer 220 and in the sacrificial layer 208 may also be exposed (not shown in the figures). Next, as shown in FIGS. 13 and 14, a second spacer 242 (which may be silicon nitride) is formed, which surrounds the protective layer 220, the sacrificial layer 208, the patterned stop layer 206 and the patterned silicon layer 204. In this way, a semiconductor substrate is formed. Further, after the source/drain regions and the gate have been formed, by using the first spacer 240 and the second spacer 242 as masks, the protective layer 220, the sacrificial layer 208, the stop layer 206 and the silicon layer 204 are removed to expose the insulating layer 202, so as to form a cavity. Then an insulator may be formed in the cavity. Finally, a semiconductor device is formed. Forming the semiconductor substrate (further forming the semiconductor substrate) by using a self alignment technology facilitates the reduction of the number of masks and the refinement of the processes. The thickness of the second spacer 242 may be 7 nm to 20 nm, such as 10 nm, 15 nm or 18 nm.

It needs to be emphasized that the gate (actually it is a gate stack layer which comprises the gate, the gate stack layer comprises a gate dielectric layer, a work function metal layer and a polycrystalline silicon layer which are accumulated in succession, and the polycrystalline silicon layer may also be replaced by a stacked metal layer) may be formed after the stop layer and the silicon layer are patterned and before the stop layer located in the area of the source/drain regions is exposed.

Figure 15:
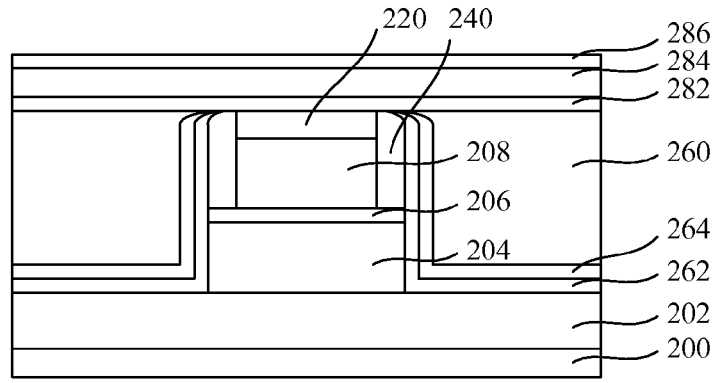
FIG. 15 is a structural sectional view after having formed a gate stack layer following the step shown in FIGS. 9 and 10, in an embodiment of the method for forming a semiconductor device according to the present invention.

Particularly, as shown in FIG. 15, after having patterned the stop layer 206 and the silicon layer 204 (as shown in FIGS. 9 and 10), a gate stack layer is formed on the insulating layer 202 (in which the gate stack layer comprises a gate dielectric layer 262, a work function metal layer 264 and a gate material layer 260, which are accumulated in succession, the gate dielectric layer 262 may be formed of Hafnium-based materials, such as one of $HfO_2$, HfSiO, HfSiON, HfTaO, HfTiO and HfZrO, or any combination thereof; the work function metal layer 264 may comprise one of TiN, TiAlN, TaN and TaAlN, or any combination thereof; and the gate material layer 260 may be metals, preferably polycrystalline silicon); next, the gate stack layer is planarized to expose the protective layer 220; thereafter, a assisting mask layer is formed, and the assisting mask layer covers the gate stack layer and the protective layer 220; the assisting mask layer may be a dielectric layer laminated with different materials; for example, when the materials of the protective layer 220 and the first spacer 240 are silicon nitride, the assisting mask layer may be a silicon oxide layer (a first assisting mask layer 282)-silicon nitride layer (a second assisting mask layer 284)-silicon oxide layer (a third assisting mask layer 286). After the above mentioned operations, only a silicon oxide layer on the substrate carrying the above mentioned structure may be seen in a top view. After that, it needs to remove the assisting mask layer and the gate stack layer located in the area of the source/drain regions before forming the semiconductor substrate; and the above mentioned method for forming the gate is performed for the purpose of the integration of the manufacturing process, and the following description is based this method. It needs to be pointed out that the gate may also be formed by using other methods, and the gate may also be formed after having formed the source/drain regions. The gate may be formed flexibly by one skilled in the art according to the teachings provided by the present invention, and it will not be described redundantly.

In this case, the thickness of the gate dielectric layer 262 may be 2 nm to 3 nm, such as 2.5 nm. Further, an interfacial oxide layer may also be formed before forming the gate dielectric layer 262, and the thickness of the interfacial oxide layer may be 0.2 nm to 0.7 nm, such as 0.5 nm, which is not shown in the figures. The thickness of the work function metal layer 264 may be 3 nm to 10 nm, such as 5 nm or 8 nm; the thickness of the gate material layer 260 may be 50 nm to 100 nm, such as 60 nm, 70 nm, 80 nm or 90 nm; the thickness of the first assisting mask layer 282 may be 2 nm to 5 nm, such as 3 nm or 4 nm; the thickness of the second assisting mask layer 284 may be 10 nm to 20 nm, such as 12 nm, 15 nm or 18 nm; the thickness of the third assisting mask layer 286 may be 10 nm to 20 nm, such as 12 nm, 15 nm or 18 nm; and the thickness of the source/drain base layer may be 5 nm to 20 nm, such as 10 nm or 15 nm.

Figure 16:
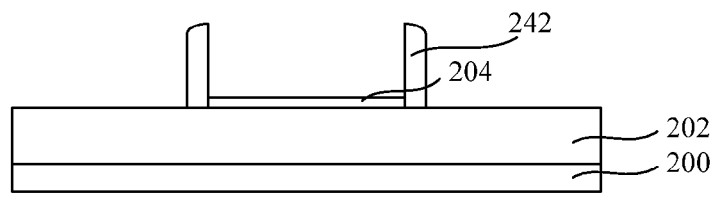
FIG. 16 is a structural sectional view after having formed a source/drain base layer in the area of the source/drain regions, in an embodiment of the method for forming a semiconductor device according to the present invention.
Figure 17:
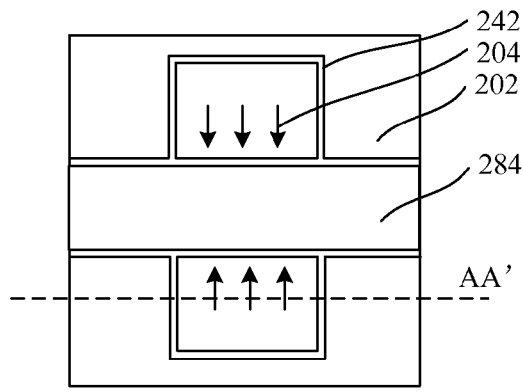
FIG. 17 is a sectional view of performing a first ion implantation operation after having formed a source/drain base layer, in an embodiment of the method for forming a semiconductor device according to the present invention.
Figure 18:
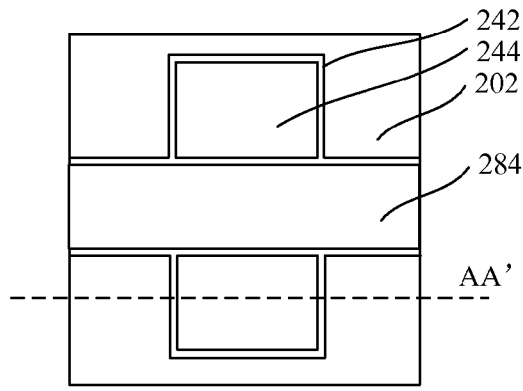
FIGS. 18 and 19 are a top view and a sectional view after having formed a second semiconductor layer on the source/drain base layer, in an embodiment of the method for forming a semiconductor device according to the present invention.
Figure 19:
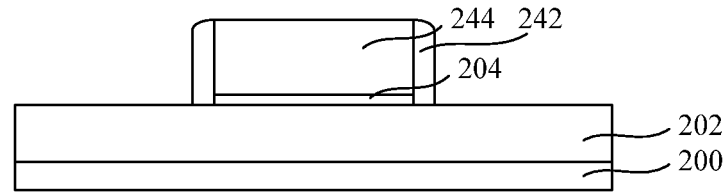
Figure 20:
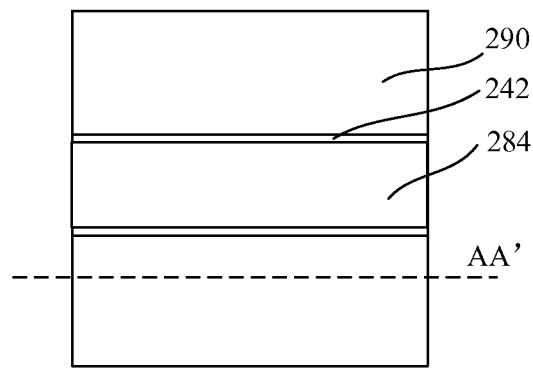
FIGS. 20 and 21 are a top view and a sectional view after having formed a first dielectric layer which is planarized, in an embodiment of the method for forming a semiconductor device according to the present invention.

In practice, as shown in FIG. 16, after having formed the semiconductor substrate, the stop layer 206 located in the area of the source/drain regions and a part of the silicon 204 in certain thickness are removed (in this case, a first assisting mask 286, i.e., a silicon oxide layer, located on the gate stack layer is also removed), so as to form a source/drain base layer (i.e., a semiconductor assisting substrate). Then, as shown in FIG. 17, a first ion implantation operation is performed along the direction (i.e., the direction indicated by the arrow in the figure) facing the first side surfaces (the first side surfaces are the exposed surface of the silicon layer after having removed a part of the silicon layer in certain thickness), so as to form a diffusion region and a halo in the silicon layer 204. Compared with the operation of performing the first ion implantation operation along the direction facing the second side surfaces in the prior art, it further facilitates the operation in practice, and also facilitates the reduction of the distance between adjacent semiconductor substrates, the reduction of the area used by the device, and in turn the reduction of the manufacturing costs. The specific process parameters of the first ion implantation operation, such as the implantation energy, the implantation dose, the times of implantation carried out and the dopants, may be adjusted flexibly depending on the design of the product, and it will not be described redundantly. Next, as shown in FIGS. 18 and 19, after having formed a second semiconductor layer 244 on the source/drain base layer by using an epitaxial method (for a PMOS device, the material of the second semiconductor layer 244 is $Si_{1-X}Ge_X$ and the doping dose may be $1\times10^{19}/cm^3$ to $1\times10^{21}/cm^3$; and for an NMOS device, the material of the second semiconductor layer 244 is Si:C and the doping dose may be $1 \times 10^{19}/cm^3$ to $1 \times 10^{21}/cm^3$), the source/drain regions may be formed. It facilitates the further regulation of the stress in the channel region by using the source/drain regions, so as to increase the carrier mobility in the channel region. In addition, the source/drain regions may also be formed by performing the ion implantation operation to the silicon layer 204 rather than removing the part of the silicon layer 204 in certain thickness after the stop layer 206 located in the source/drain regions is removed.

Figure 21:
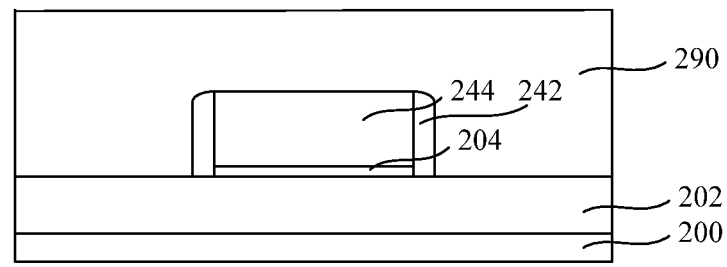
Figure 22:
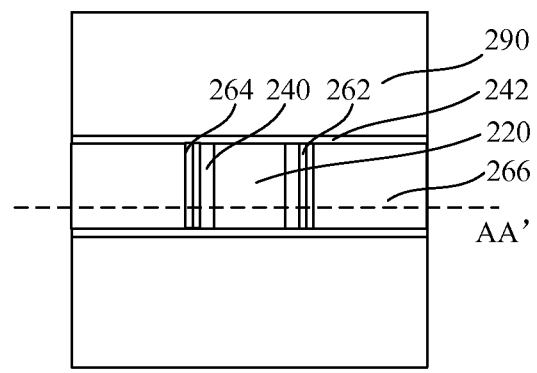
FIGS. 22 and 23 are a top view and a sectional view after having formed gates, in to an embodiment of the method for forming a semiconductor device according to the present invention.
Figure 23:
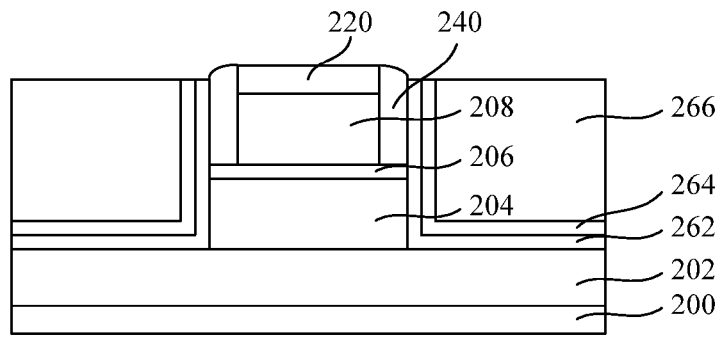
Figure 24:
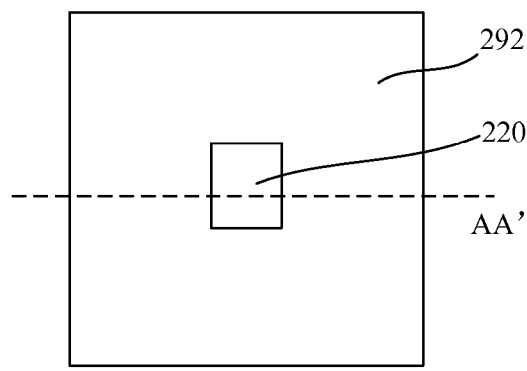
FIGS. 24 and 25 are a top view and a sectional view after having formed a second dielectric layer which is planarized, in an embodiment of the method for forming a semiconductor device according to the present invention.
Figure 25:
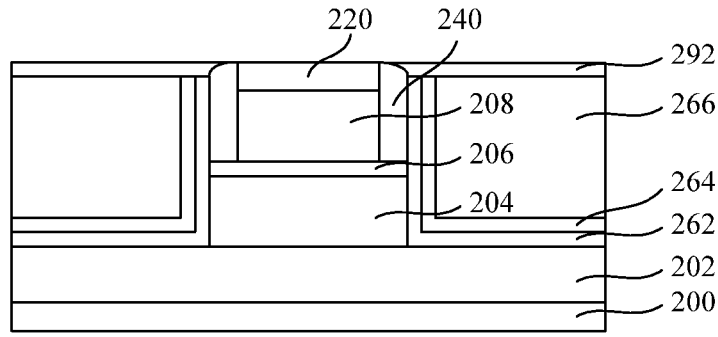
Figure 26:
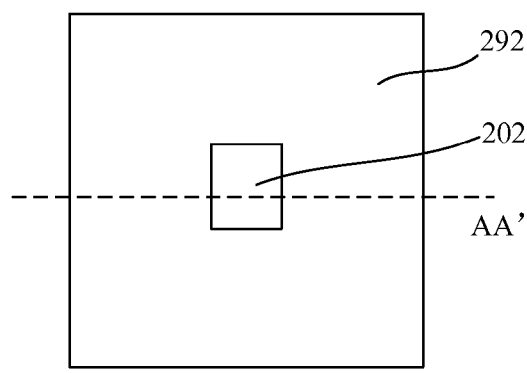
FIGS. 26 and 27 are a top view and a sectional view after having formed a cavity, in an embodiment of the method for forming a semiconductor device according to the present invention.
Figure 27:
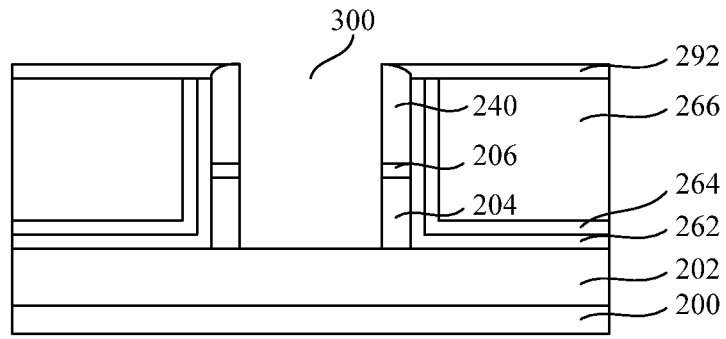

Next, a cavity is formed. First, as shown in FIGS. 21 and 22, a first dielectric layer 290 (such as silicon oxide) which is planarized is formed, and a second assisting film layer 284 in the assisting mask layer is exposed. The operation of exposing the second assisting film layer 284 may be performed by employing CMP (Chemical Mechanical Polishing). Next, as shown in FIGS. 22 and 23, the assisting mask layer with residual second assisting film layer 284 (a silicon nitride layer) and the first assisting film layer 282 (a silicon oxide layer) and a part of the gate stack structure in its height are removed, to form a gate 266. In the direction of the thickness of the silicon layer 204, the gate 266 covers at least the silicon layer 204 (for forming a channel), which facilitates the increase of the effective area in the channel region of the device, and in turn the increase of the carrier mobility in the channel. After having been subjected to this operation, a residual part of the protective layer 220 with certain thickness is still kept. As shown in FIGS. 24 and 25, a second dielectric layer 292 is formed (such as silicon oxide for reducing the damage to the existing structure when removing the protective layer 220 to form the cavity). The protective layer 220 is exposed by the second dielectric layer 292 which covers the first spacer 240 and the second spacer 242, and the above operation may be performed by depositing the second dielectric layer 292 and then carrying out the CMP process to the second dielectric layer 292. Next, as shown in FIGS. 26 and 27, by using the second dielectric layer 292 as a mask, the protective layer 220, the sacrificial layer 208, the stop layer 206 and the silicon layer 204 are removed to expose the insulting layer 202, so as to form a cavity 300. It needs to be pointed out that it actually has an smaller impact on other structures when forming the cavity 300 due to the protection of the second dielectric layer 292, but the morphology of the cavity 300 is determined because of the existence of the first spacer 240 and the second spacer 242. Therefore, to some extent, the first spacer 240 and the second spacer 242 also function as masks. When the cavity 300 is formed after the source/drain regions are formed, the counterforce provided by the silicon layer 204 (a first semiconductor layer) which filled up the cavity 300 originally and by the stop layer 206 and the sacrificial layer 208 and subjected by the source/drain regions disappear, such that the loss of the stress in the source/drain regions becomes smaller.

Figure 28:
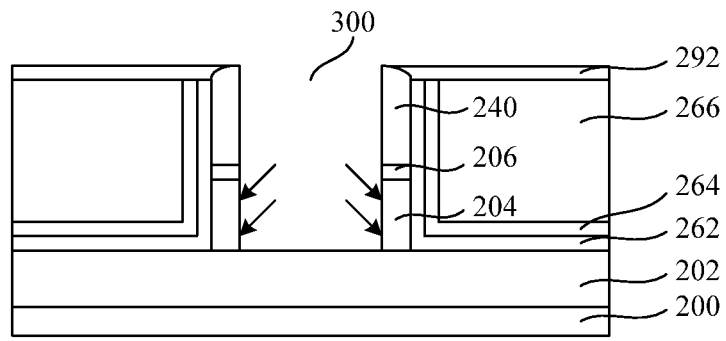
FIG. 28 is a sectional view of performing a second ion implantation operation, in an embodiment of the method for forming a semiconductor device according to the present invention.

Following that, as shown in FIG. 28, after having formed the cavity 300, a second ion implantation operation is performed to the cavity 300 (the direction is indicated by the arrow as shown in the figure), so as to form a super-steep retrograde well in the silicon layer 204 (for providing a channel). Specifically, for an NMOS device, the channel layer comprises a P-type super-steep retrograde well. For a PMOS device, the channel layer comprises a N-type super-steep retrograde well. It facilitates the thinning of the depletion layer, and the further reduction of the short-channel effect. The specific process parameters of the second ion implantation operation, such as the implantation energy, the implantation dose, the implantation times and the dopants, may be adjusted flexibly depending on the design of the product, and it will not be described redundantly.

Figure 29:
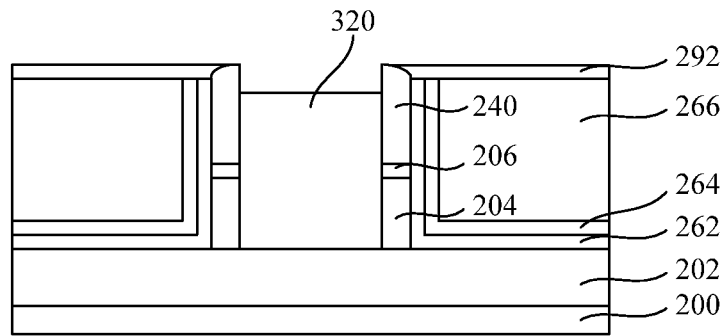
FIG. 29 is a sectional view after filling a third dielectric layer in the cavity, in an embodiment of the method for forming a semiconductor device according to the present invention.

Subsequently, as shown in FIG. 29, a third dielectric layer 320 is filled into the cavity 300 by using an etching back process. The third dielectric layer 320 is an insulating material (which is referred to an insulator; if the third dielectric layer 320 is removed after the gate 266 is formed, the third dielectric layer 320 may be formed of a material different from that of the second dielectric layer 292, first spacer 240, stop layer 206 and silicon layer 204, such as silicon carbide. If it is needed to keep the third dielectric layer 320 remained after having the gate 266 is formed, the third dielectric layer 320 may be formed of any material different from that of the second dielectric layer 292, such as silicon nitride). An insulator is formed in the cavity 300, and it has a tensile stress for a PMOS device, or a compression stress for an NMOS device, by regulating the stress of the insulator. The stress of the insulator is applied to the semiconductor substrate to generate a stress with an opposite type in the semiconductor substrate, i.e., a compression stress for the semiconductor substrate in a PMOS device, or a tensile stress for the semiconductor substrate in an NMOS device. It facilitates the further regulation of the stress in the channel region of the device, so as to further increase the carrier mobility in the channel region. The insulator covers at least the first semiconductor layer which is patterned, and it facilitates the uniform provision of the stress to the channel region of the device. The material of the insulator is one of silicon nitride, silicon oxide, or any combination thereof. So far, the semiconductor device has already been formed.

After this, as shown in FIGS. 30 and 31, the second dielectric layer 292 is removed to expose the gate 266 and the source/drain regions 244. As shown in FIGS. 32 and 33, a metal layer is formed on the gate 266 and the source/drain regions 244 and it is subjected to a heat treatment operation, and the unreacted part of the metal layer is removed, so that a metal silicide layer 246 (namely a contact region for reducing the contact resistance when subsequently forming a metal interconnection) may be formed on the gate 266 and the source/drain regions 244.

Moreover, the application of the present invention is not limited to the processes, structures, manufacturing, substance composition, means, methods and steps of the particular embodiments described in the specification. According to the disclosure of the present invention, one skilled in the art would readily understand that for the processes, structures, manufacturing, substance composition, means, methods or steps currently existing or to be developed in future, when performing substantially the same functions as that of the respective embodiments described in the present invention or producing substantially the same effects, they may be applied according to the teachings of the present invention, without departing from the protective scope claimed by the present invention.

The invention claimed is:
1. A semiconductor device, comprising:
a semiconductor substrate located on an insulating layer, the semiconductor substrate including a first set of opposite side surfaces and a second set of opposite side surfaces;
source/drain regions abutting the first set of opposite side surfaces;
a first gate located on one side surface of the second set of opposite side surfaces;
a second gate located on the other side surface of the second set of opposite side surfaces; and an insulator located on the insulating layer and embedded in the semiconductor substrate, wherein the insulator applies stress therein to the semiconductor substrate.

2. The semiconductor device according to claim 1, characterized in that channel layers and mask layers are sandwiched between the second side surfaces and the insulator, and the channel layers are sandwiched between the insulating layer and the mask layers.

3. The semiconductor device according to claim 2, characterized in that the channel layer has a thickness of 5 nm to 40 nm in the direction perpendicular to the second side surfaces.

4. The semiconductor device according to claim 2, characterized in that for an NMOS device, the channel layer comprises a P-type super-steep retrograde well; and for a PMOS device, the channel layer comprises an N-type super-steep retrograde well.

5. The semiconductor device according to claim 2, characterized in that the gates or the insulator covers at least the channel layers in the direction perpendicular to the insulating layer.

6. The semiconductor device according to claim 1, characterized in that the insulator has a tensile stress for a PMOS device, and a compression stress for an NMOS device.

7. The semiconductor device according to claim 1, characterized in that the material of the insulator is one of silicon nitride and silicon oxide, or any combination thereof.

8. The semiconductor device according to claim 1, characterized in that the first side surfaces are perpendicular to the second side surfaces.

9. The semiconductor device according to claim 1, characterized in that the semiconductor device further comprises a semiconductor assisting substrate, wherein the upper surface of the semiconductor assisting substrate is lower than the upper surface of the semiconductor substrate, the semiconductor assisting substrate abuts the first side surfaces, and the source/drain regions are formed on the semiconductor assisting substrate.

10. The semiconductor device according to claim 9, characterized in that the semiconductor assisting substrate comprises Si, the source/drain regions are $Si_{1-X}Ge_X$, and X has a value ranging from 0.1 to 0.7 in the $Si_{1-X}Ge_X$.

11. The semiconductor device according to claim 9, characterized in that the semiconductor assisting substrate comprises Si, the source/drain regions are Si:C, and the value of the atomic number percentage of C is in the range of 0.2% to 2% in the Si:C.

12. A method for forming a semiconductor device, characterized in that it comprises:
    forming a semiconductor substrate on an insulating layer, the semiconductor substrate including a first set of opposite side surfaces and a second set of opposite side surfaces;
    forming source/drain regions abutting the first set of opposite side surfaces;
    forming a first gate located on one side surface of the second set of opposite side;
    forming a second gate located on the other side surface of the second set of opposite side surfaces;
    removing a part of the materials within the semiconductor substrate to form a cavity in the semiconductor substrate, so as to expose the insulating layer; and
    forming an insulator in the cavity so that the insulator is located on the insulating layer and embedded in the semiconductor or substrate, wherein the insulator applies stress therein to the semiconductor substrate.

13. The method according to claim 12, characterized in that the step of forming the semiconductor substrate comprises:
    forming, on the insulating layer, a first semiconductor layer, a stop layer, a patterned sacrificial layer and a patterned protective layer, and a first spacer surrounding the patterned sacrificial layer and protective layer;
    forming the stop layer and the first semiconductor layer which are patterned with the first spacer as a mask;
    determining the source/drain regions and removing portions of the first spacer, the protective layer and the sacrificial layer which cover the source/drain regions, so as to expose the stop layer;
    forming a second spacer surrounding the protective layer and the sacrificial layer;
    wherein the source/drain regions abut the first set of opposite side surfaces in the patterned first semiconductor layer;
    the gates are located on the second set of opposite side surfaces in the patterned first semiconductor layer; and
    the step of forming the cavity in the semiconductor substrate comprises:
    removing the protective layer, the sacrificial layer and the first semiconductor layer using the first spacer and the second spacer as masks, wherein the material of the stop layer is different from the materials of the protective layer, the sacrificial layer, the first semiconductor layer, the first spacer and the second spacer.

14. The method according to claim 12, characterized in that the first side surfaces are perpendicular to the second side surfaces.

15. The method according to claim 13, characterized in that the first spacer has a thickness of 5 nm to 40 nm in the direction perpendicular to the second side surfaces.

16. The method according to claim 13, characterized in that the step of forming the source/drain regions comprises:
    after having formed the semiconductor substrate, removing the stop layer located in the source/drain regions, and a part of the first semiconductor layer with certain thickness, so as to form a source/drain base layer; and
    forming a second semiconductor layer on the source/drain base layer.

17. The method according to claim 16, characterized in that in the first semiconductor layer comprises Si, the second semiconductor layer is $Si_{1-X}Ge_X$, and the $Si_{1-X}Ge_X$ has a value ranging from 0.1 to 0.7.

18. The method according to claim 16, characterized in that the first semiconductor layer comprises Si, the second semiconductor layer is $Si_{1-X}Ge_X$, and the value of the atomic number percentage of C is in the range of 0.2% to 2% in the Si:C.

19. The method according to claim 16, characterized in that before forming the second semiconductor layer on the source/drain base layer, it further comprises performing a first ion implantation operation along the direction facing the first side surfaces, so as to form a diffusion region and a halo.

20. The method according to claim 13, characterized in that the step of forming the gates comprises:
    forming a gate stack layer before determining the source/drain regions, so that the gate stack layer covers at least the patterned first semiconductor layer in the direction perpendicular to the insulating layer.

21. The method according to claim 13, characterized in that it further comprises: performing a second ion implantation operation to the cavity after having formed the cavity, so as to form a P-type super-steep retrograde well for an NMOS device or a N-type super-steep retrograde well for a PMOS device.

22. The method according to claim 12, characterized in that the insulator covers at least the patterned first semiconductor layer.

23. The method according to claim 12, characterized in that the insulator has tensile stress for a PMOS device, or compression stress for an NMOS device.

24. The method according to claim 12, characterized in that the material of the insulator is one of silicon nitride and silicon oxide, or a combination thereof.

* * * * *